(12) United States Patent
Gerbi

(10) Patent No.: US 7,394,103 B2
(45) Date of Patent: Jul. 1, 2008

(54) ALL DIAMOND SELF-ALIGNED THIN FILM TRANSISTOR

(75) Inventor: Jennifer Gerbi, Champaign, IL (US)

(73) Assignee: UChicago Argonne, LLC, Chicago, IL (US)

( * ) Notice: Subject to any disclaimer, the term of this patent is extended or adjusted under 35 U.S.C. 154(b) by 5 days.

(21) Appl. No.: 11/226,703

(22) Filed: Sep. 13, 2005

(65) Prior Publication Data

US 2006/0060864 A1 Mar. 23, 2006

Related U.S. Application Data

(60) Provisional application No. 60/609,386, filed on Sep. 13, 2004.

(51) Int. Cl.
*H01L 31/0312* (2006.01)
*H01L 21/00* (2006.01)
*H01L 29/78* (2006.01)

(52) U.S. Cl. .................. 257/77; 438/105; 257/410; 257/E21.041; 257/E21.049; 257/E21.182

(58) Field of Classification Search .................. 257/77, 257/410; 438/105
See application file for complete search history.

(56) References Cited

U.S. PATENT DOCUMENTS

| | | | | |
|---|---|---|---|---|
| 4,981,818 A | * | 1/1991 | Anthony et al. | 438/494 |
| 5,107,315 A | * | 4/1992 | Kumagai et al. | 257/410 |
| 5,173,761 A | * | 12/1992 | Dreifus et al. | 257/22 |
| 5,254,862 A | * | 10/1993 | Kalyankjumar et al. | 257/77 |
| 5,371,383 A | * | 12/1994 | Miyata et al. | 257/77 |
| 5,382,809 A | * | 1/1995 | Nishibayashi et al. | 257/77 |
| 5,382,822 A | * | 1/1995 | Stein | 257/410 |
| 5,420,443 A | * | 5/1995 | Dreifus et al. | 257/77 |
| 5,455,432 A | * | 10/1995 | Hartsell et al. | 257/77 |
| 5,491,348 A | * | 2/1996 | Koyamao et al. | 257/66 |
| 5,506,422 A | * | 4/1996 | Dreifus et al. | 257/77 |
| 5,523,588 A | * | 6/1996 | Nishimura et al. | 257/77 |
| 5,633,513 A | * | 5/1997 | Koyama et al. | 257/77 |
| 6,492,309 B1 | * | 12/2002 | Behr et al. | 510/175 |
| 2005/0110024 A1 | * | 5/2005 | Swain et al. | 257/77 |

FOREIGN PATENT DOCUMENTS

JP 7-321317 * 12/1995

* cited by examiner

*Primary Examiner*—Evan Pert
(74) *Attorney, Agent, or Firm*—Olson & Cepiritis, Ltd.; Harry M. Levy

(57) ABSTRACT

A substantially all diamond transistor with an electrically insulating substrate, an electrically conductive diamond layer on the substrate, and a source and a drain contact on the electrically conductive diamond layer. An electrically insulating diamond layer is in contact with the electrically conductive diamond layer, and a gate contact is on the electrically insulating diamond layer. The diamond layers may be homoepitaxial, polycrystalline, nanocrystalline or ultrananocrystalline in various combinations.

A method of making a substantially all diamond self-aligned gate transistor is disclosed in which seeding and patterning can be avoided or minimized, if desired.

22 Claims, 5 Drawing Sheets

ALL DIAMOND SELF-ALIGNED THIN FILM TRANSISTOR

RELATED APPLICATIONS

This application, pursuant to 37 C.F.R. 1.78(c), claims priority based on provisional application Ser. No. 60/609,386 filed on Sep. 13, 2004.

CONTRACTUAL ORIGIN OF THE INVENTION

The United States Government has rights in this invention pursuant to Contract No. W-31-109-ENG-38 between the U.S. Department of Energy (DOE) and The University of Chicago representing Argonne National Laboratory.

BACKGROUND OF THE INVENTION

Thin film diamond has been termed many things, from polycrystalline to nanocrystalline to "ultra" nanocrystalline (UNCD). All forms of diamond can be grown via different growth processes, (such as chemical vapor deposition processes including plasma enhanced or hot-wire), and all are applicable here.

A homoepitaxial single crystal diamond film is a perfect single crystal diamond, and can only be grown on a single crystal diamond substrate. If a similar process is used with a non-diamond substrate, polycrystalline diamond is formed. Depending on the growth parameters used, such films have different preferred crystalline orientations, grain sizes, surface roughness, and quality. If the preferred orientation of such films can be controlled via special substrate layers, or modifications to the growth process, as to promote certain crystal faces with a preferred texture, "highly oriented polycrystalline diamond", or HOPD, can be produced. This film is a polycrystalline diamond, large-grained material with much lower surface roughness, from several microns on average to hundreds of nanometers on average.

If the initial nucleation density of the substrate is particularly high, and the film grown limited in thickness, a very fine-grained polycrystalline diamond can be grown. The key is that the thickness must be kept very small as to limit lateral and competitive grain growth. Such films have been termed "nanocrystalline" diamond (NCD), although the grain sizes can vary from hundreds of nanometers to larger. The key difference with this type of film, other than the much larger numbers of grain boundaries per area, is the benefit of much reduced surface roughness down to tens of nanometers on average as long as the film thickness is limited. Finally, an extremely fine-grained diamond material, with an extremely large number of grain boundaries, can be produced by altering the diamond thin film growth process. Such material may or may not be equiaxed crystalline, but the surface roughness is extremely low down to a few nanometers on average and does not vary with thickness. This material has been termed "ultra" nanocrystalline diamond, or UNCD, in order to delineate it from the "nanocrystalline" diamond above. The grain sizes in this case are between 2 and 5 nm wide, and do not increase with film thickness. Of note for this application, UNCD does show unusual extremely high n-type conductivity when doped with nitrogen, as opposed to the other forms of thin-film diamond discussed above. UNCD has been reported in the patent and scientific literature by inventors and authors at Argonne National Laboratory and others. The invention described here can use any of the forms of diamond described above, as long as they can be made either electrically conductive (via doping, either p- or n-type) or electrically insulating (intrinsic diamond is highly insulating; hydrogen or another passivant may be needed to remove defects from grain boundaries of poly-, nano-, and ultrananocrystalline films). Different types of diamond thin film can be used within the same device.

SUMMARY OF THE INVENTION

Accordingly, a principal object of the present invention is to provide a substantially all diamond transistor or an all diamond transistor and a method of making same.

Another object of the present invention is to provide a substantially all diamond transistor, comprising an electrically insulating substrate, an electrically conductive diamond layer on the electrically insulating substrate, a source contact and a drain contact on the electrically conductive diamond layer, an electrically insulating diamond layer in contact with the electrically conductive diamond layer, and a gate contact on the electrically insulating diamond layer.

Another object of the present invention is to provide a method of making a substantially all diamond self-aligned gate transistor, comprising providing an electrically insulating substrate, depositing an electrically conductive diamond layer on the electrically insulating substrate, establishing a source contact and a drain contact on the electrically conductive diamond layer, depositing an electrically insulating diamond layer in contact with the electrically conductive diamond layer, and providing a gate contact on the electrically insulating diamond layer.

A further object of the invention is to provide a substantially all diamond transistor, comprising an electrically insulating substrate, an electrically conductive diamond layer less than about 20 nm thick on the electrically insulating substrate, a source contact and a drain contact on the electrically conductive diamond layer, a self-aligned electrically insulating diamond layer less than about 200 nm thick in contact with the electrically conductive diamond layer, and a gate contact on the electrically insulating diamond layer.

A final object of the invention is to provide a substantially all diamond transistor, comprising an electrically insulating substrate of homoepitaxial diamond, an electrically conductive boron doped homoepitaxial layer less than about 10 nm thick on the electrically insulating substrate of homoepitaxial diamond, a tungsten source contact and a Mo drain contact on the electrically conductive boron doped homoepitaxial layer, a self-aligned intrinsic insulating homoepitaxial diamond layer less than about 200 nm thick in contact with the electrically conductive boron doped homoepitaxial layer, and a tungsten gate contact on the self-aligned homoepitaxial diamond layer.

BRIEF DESCRIPTION OF THE DRAWINGS

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DESCRIPTION OF THE PREFERRED EMBODIMENT

Figure 1:
FIGS. 1-5 are schematic representations of the steps necessary to fabricate a substantially all diamond or all diamond transistor.
Figure 2:
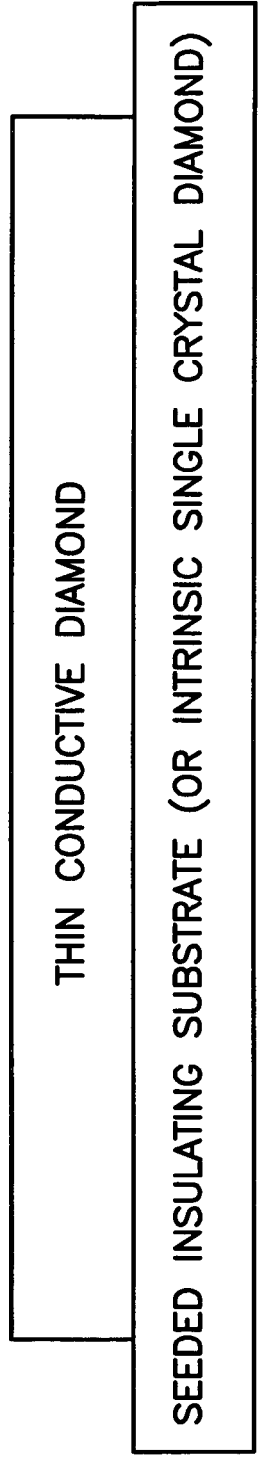
Figure 3:
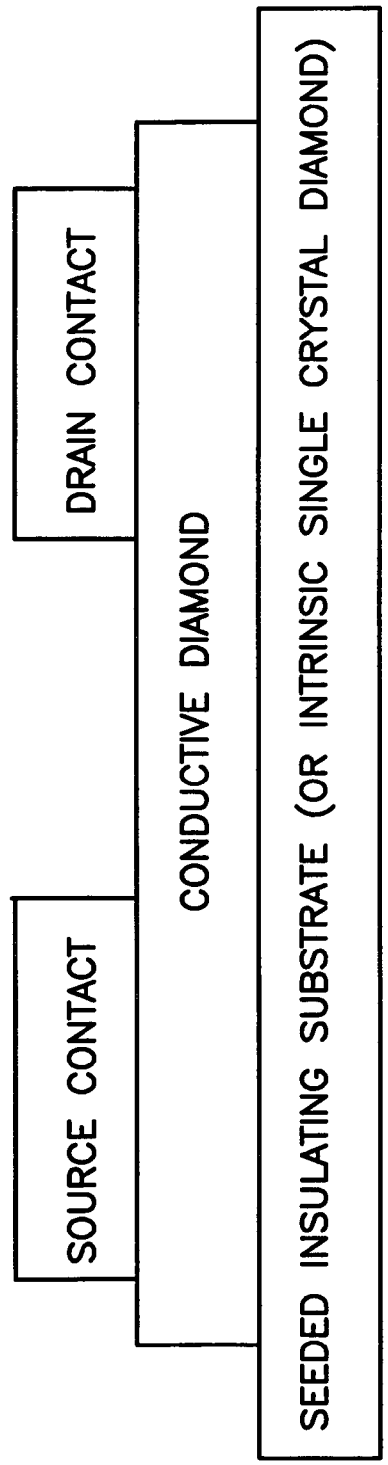
Figure 4:
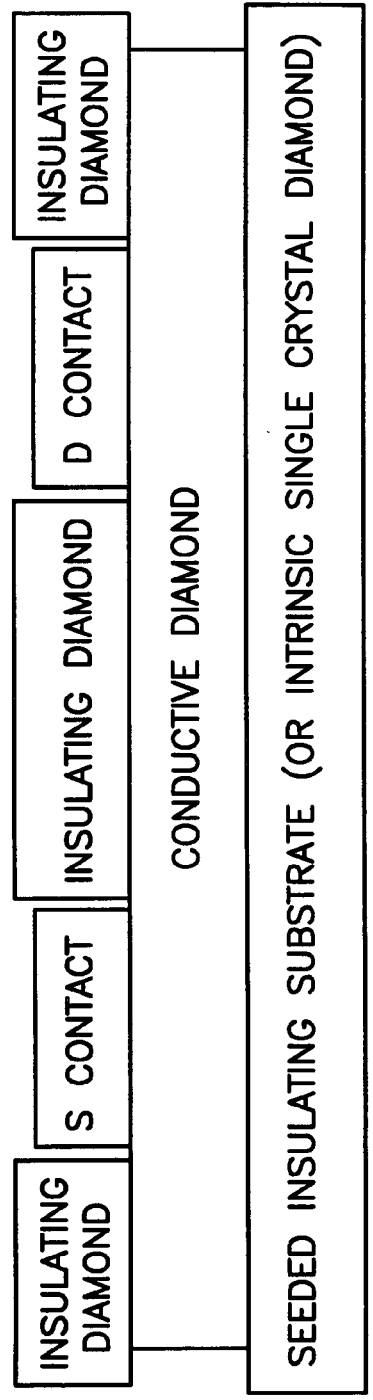
Figure 5:
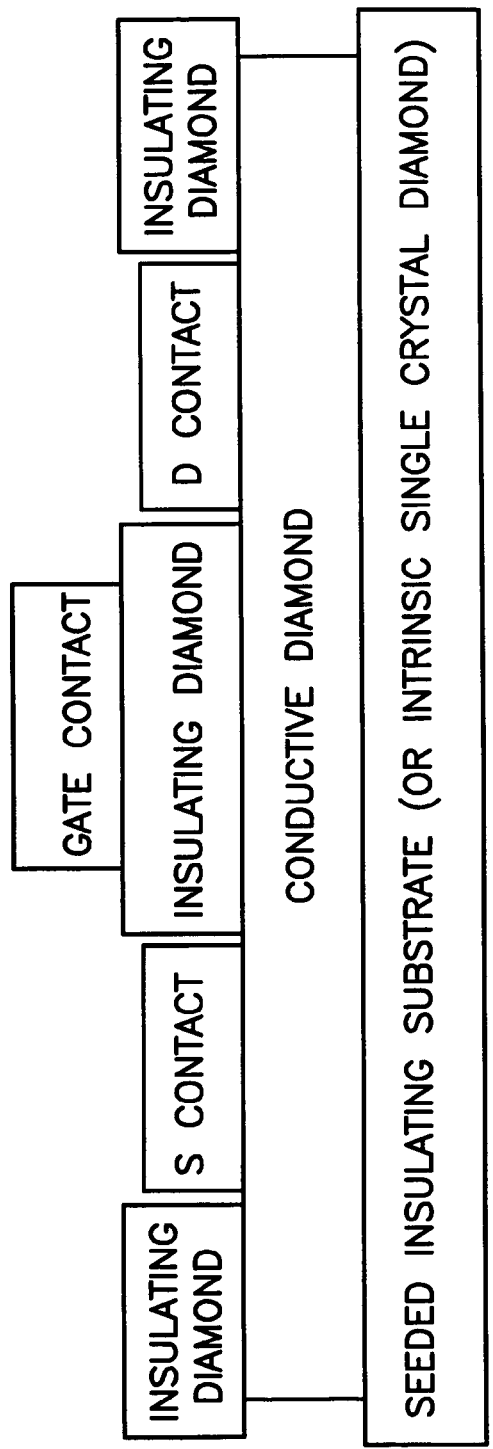

Although any of the thin-film forms of diamond mentioned above apply to this invention, the description will refer mostly to UNCD. The reduced roughness of UNCD, HOPD, and nanocrystalline diamond indicate that these types of thin film diamond may be the best candidates for such a device if fabricated with a non-single crystal diamond substrate. If a single crystal diamond substrate is used, the use of homoepitaxial diamond layers will be enabled, and a very high-quality device will result.

All of the types of diamond listed above have the limitation of nucleation hindered growth. When depositing any of these films on a non-diamond substrate, the substrate must be "seeded"; this process usually entails the application of diamond powder to the surface of the substrate, by either an ultrasound solution of physical abrasion. There are also plasma treatments ("bias enhanced nucleation") and other ways of "seeding" the substrate. A key phenomenon of import to this invention is that thin film diamond will grow on other forms of diamond, without a seeding step; UNCD can grow on nanocrystalline diamond, nanocrystalline diamond can be grown on UNCD, UNCD can be grown even on single crystal diamond, etc., with a near-perfect nucleation step. The only limitation is that homoepitaxial diamond can only be grown on single crystal diamond. This invention makes use of this fact in order to produce a type of self-aligned transistor, that is a transistor manufactured without seeding if all diamond or with minimum seeding if a non-diamond substrate is used.

The device and method of this invention described here involves the following steps: 1) an appropriate substrate is chosen, and this can be non-diamond, such as a Si wafer with an insulating layer of $SiO_2$ on the surface, any other type of insulating substrate that can withstand the diamond deposition process—it can even be insulating single crystal diamond; 2) if non-diamond, this substrate is treated with any "seeding" process to enable diamond growth; 3) a conductive diamond layer is deposited on the substrate using any diamond deposition process (e.g. forms of chemical vapor deposition including microwave plasma-enhanced and hot-wire); 4) (optional) this conductive layer is patterned (for example, using standard oxygen reactive ion etching), if device isolation is desired—alternatively, the "seeding" process in step 2) can itself be patterned if using a non-diamond substrate, so the resulting conductive diamond layer is already patterned as grown; 5) source and drain contacts are formed on the conductive diamond layer by any process (e.g. sputtering, chemical vapor deposition), patterned (deposited through a shadow mask, or patterned post-growth using typical processes), and these contacts must make good Ohmic contact to the conductive diamond layer, and must have high enough melting temperatures to withstand the next step; 6) insulating diamond is deposited over the entire substrate, it will grow where the conductive diamond is exposed, but not on the metal contacts, as the device is not re-seeded at this time; 7) final top gate contacts are made on the insulating diamond layer. These contacts need to have melting temperatures high enough to withstand whatever temperatures the device will be exposed to during use—as this is the final step, they do not need to be able to withstand the diamond growth processes.

This invention includes devices made with any electrically conductive diamond, either p-type (such as boron doped polycrystalline diamond or, possibly, boron-doped UNCD or n-type (such as phosphorous doped polycrystalline diamond or nitrogen doped UNCD, and any diamond that is insulating (i.e. intrinsic diamond, or fully hydrogen-doped UNCD or nanocrystalline diamond). The key to this invention is the idea of using high-temperature metal contacts for the source and drain, that these contacts are deposited after the first diamond layer is deposited, and the fact that subsequent insulating diamond layers will grow on the initial conductive diamond layer, but not the contacts—thereby making the device self-aligned and eliminating a processing step.

An all-diamond transistor operates in a stable fashion at very high temperatures (at which normal Si-based devices would fail due to dopant diffusion or other types of material failure), in highly corrosive environments, and is biocompatible (within the limits of the contact metals used). An all diamond transistor has extremely good electrical characteristics depending on the quality of the diamond used, and is an efficient way to drive other diamond-based devices, including micro-mechanical systems (MEMS). To that end, the materials used for the device contacts should fulfill two requirements: not melt at the temperatures reached during diamond deposition (e.g. ~900° C., or lower for lower temperature diamond growth processes) and make good electrical contacts to the conductive diamond layer. For nitrogen-doped UNCD, we have shown that all metals used to date make excellent Ohmic contacts, and so Mo has been used here due to the high melting point of the material. Other high temperature metals, such as, but not limited to, Ti and its alloys, Mo alloys, metal carbides, and metallic ceramics work as well, provided they are good electrical conductors and have the requisite melting points. Forming Ohmic contacts to non-UNCD forms of conductive diamond is more challenging, but can be accomplished with carbide forming metals, and high temperature or ion-bombardment treatments by those of ordinary skill in the art.

The use of an all-diamond thin film transistor is useful for other reasons. Diamond films, in particular films with low surface roughnesses such as UNCD and nanocrystalline diamond, are useful for use in MEMS and similar other devices. The ability to make electronics out of the same films and using the same processing steps enable particularly affordable on-board electronics to drive MEMS devices (such as chemical sensors or RF switches). Another advantage of this invention is that fabrication is simplified with such a device as is described here, as diamond etching steps are reduced, and the process does not require the deposition of a gate oxide. This is key, as the insulating layer for thin film transistors is usually an oxide; however, growing oxide on diamond is actually very difficult, as the oxygen used during such thin film growth processes etches the diamond very effectively. While it is possible to engineer the use of oxides on diamond with the applications of other barrier films and processes, the procedure becomes much more expensive and time consuming.

The use of a non-oxygen containing growth process for the insulating layer is of great interest for diamond electronics, and the use of a diamond layer itself would perhaps yield the best results in terms of film growth on an existing diamond film. Theoretically, pure diamond is the best electrical insulator.

Using intrinsic undoped homoepitaxial, nano- or polycrystalline diamond (or HOPD) as the gate insulator is acceptable, as is undoped UNCD, although a hydrogen treatment during growth may be needed to passivate conductive grain boundary defects.

The fabrication of an all-electrically conducting diamond thin film transistor was attempted. A thick layer of nitrogen-doped UNCD (deposited by microwave plasma enhanced CVD with the following conditions: 20% N gas, 1.4% $CH_4$ gas, and 79.6% Ar gas, at a total pressure of 150 mbar and a temperature of 900° C.) was deposited on a Si wafer (with one micron of thermal oxide previously grown on top to make it electrically insulating), and the wafer was pretreated in a methanol plus diamond nanopowder solution (ultrasonicated for 30 minutes) in order to provide nucleation sites for the UNCD. Shadow masking was then used to deposit Mo contacts via sputtering, and a hydrogen-doped UNCD layer deposited on top, followed by an Au gate contact. As predicted, the hydrogen-doped UNCD only grew on the underlying nitrogen-doped electrically conducting diamond layer, but not on the contact metal. The devices were tested using a room-temperature probe station. It was confirmed that all of the devices leaked readily through the gate (i.e. through the hydrogen-doped UNCD), indicating that the hydrogen-doped UNCD used here did not, in fact, have the requirements for an electronically insulating layer. All other aspects of the device fabrication worked properly. We believe that significant residual nitrogen in the growth chamber (confirmed with optical emission spectroscopy) hindered the passivation of the grain boundary defects with hydrogen, causing the failure of the gate insulator.

The use of a different type of diamond layer for an insulating layer is straightforward. One such growth process would use a mostly hydrogen plasma, with ~1% methane, using higher gas flows, a lower total pressure, and an unheated or cooled substrate stage if using microwave enhanced chemical vapor deposition (the effective temperature of the substrate during growth would still be about 800° C., the hydrogen plasma heats up the substrate much more than the argon one used for UNCD.) Alternatively, hot-wire chemical vapor deposition or radio-frequency plasma enhanced chemical vapor deposition could be used, along with any alternative ways to deposit diamond thin films. This invention does not depend on the use of any one type of diamond growth process. All other steps would be the same.

One alternative for a substantially all diamond transistor is to provide an electrically insulating substrate that includes $SiO_2$ and an electrically conducting diamond layer of nitrogen doped UNCD less than about 20 nm thick, but not limited to this thickness, said electrically insulating diamond layer being nanocrystalline diamond with contacts of Ti or Mo or alloys thereof and a gate of Ti or Mo or alloys thereof or Au.

Another alternative for the conductive layer, if it is desired for it to be as thin as possible, is to first deposit a layer of nano-, polycrystalline, or HOD, insulating diamond on a Si, $SiO_2$, or other substrate. Then, the n- or p-doped UNCD (or other conductive diamond) nucleates directly on that initial insulating polycrystalline layer much better than it does on nanopowder-seeded substrates. A very thin conductive layer (less than about 20 nanometers (nm)) is achieved, and the device works better (i.e. achieves device saturation more easily). The rest of the steps would be the same. Finally, if a very high quality device is desired, one can start with an insulating single crystal diamond, and grow very thin homoepitaxial conductive and insulating layers (less than about 200 nm, preferably less than about 20 nm) for the device. This results in the highest quality, (and most expensive), device.

The most preferred all diamond transistor is an electrically insulating substrate of homoepitaxial diamond, an electrically conductive boron doped homoepitaxial layer less than about 10 nm thick on the electrically insulating substrate of homoepitaxial diamond, a tungsten source contact and a tungsten drain contact on the electrically conductive boron doped homoepitaxial layer, a self-aligned intrinsic, insulating homoepitaxial diamond layer less than about 200 nm thick in contact with the electrically conductive boron doped homoepitaxial layer, and a tungsten gate contact on the self-aligned homoepitaxial diamond layer.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A substantially all diamond laterally self aligned transistor free of residue from etching, comprising
    an electrically insulating substrate,
    an electrically conductive diamond layer on said electrically insulating substrate,
    a source contact and a drain contact on said electrically conductive diamond layer, an electrically insulating diamond layer in contact with said electrically conductive diamond layer, and
    a gate contact on said electrically insulating diamond layer, wherein all of the diamond layers are either polycrystalline or HOPD or nanocrystalline or UNCD, or any combination thereof and the average grain size of the UNCD is in the range of from about 2 to about 6 nanometers (nm).

2. The substantially all diamond transistor of claim 1, wherein said substrate is a single crystal diamond (homoepitaxial).

3. The substantially all diamond transistor of claim 1, wherein said substrate is one or more of a polycrystalline or a highly oriented polycrystalline diamond (HOPD), or a nanocrystalline or an ultrananocrystalline (UNCD) diamond or a combination thereof.

4. The substantially all diamond transistor of claim 1, wherein said substrate is a non-diamond material or includes a non-diamond material coated at least in part with electrically insulating diamond.

5. The substantially all diamond transistor of claim 1, wherein said electrically conductive diamond layer is homoepitaxial.

6. The substantially all diamond transistor of claim 1, wherein said electrically conductive layer is one or more of polycrystalline or HOPD or nanocrystalline or UNCD.

7. The substantially all diamond transistor of claim 1, wherein said insulating diamond layer is one or more of polycrystalline or (HOPD) or nanocrystalline or UNCD diamond.

8. The substantially all diamond transistor of claim 1, wherein said insulating diamond layer is homoepitaxial.

9. The substantially all diamond transistor of claim 1, wherein at least one diamond layer is homoepitaxial and the other diamond layers are either polycrystalline or HOPD or nanocrystalline or UNCD.

10. A method of making a substantially all diamond laterally self-aligned gate transistor wherein at least one diamond layer is UNCD and the average grain size of the UNCD is in the range of from about 2 to about 6 nanometers, comprising
    providing an electrically insulating substrate,
    depositing an electrically conductive diamond layer on the electrically insulating substrate,
    establishing a source contact and a drain contact on the electrically conductive diamond layer,
    depositing an electrically insulating diamond layer in contact with the electrically conductive diamond layer, and
    providing a gate contact on the electrically insulating diamond layer.

11. The method of claim 10, wherein the substrate includes a non-diamond material seeded with diamond powder and thereafter growing a diamond layer thereon.

12. The method of claim 10, wherein the substrate consists of diamond.

13. The method of claim 10, wherein the substrate includes a diamond surface and the electrically conductive diamond layer is deposited directly thereon without seeding.

14. The method of claim 10, wherein the electrically insulating diamond layer is deposited directly on the electrically conducting diamond layer after the source and drain contacts are established without seeding and is self aligned.

15. The method of claim 10, wherein the electrically insulating and conducting diamond layers are one or more of polycrystalline or HOPD or nanocrystalline or UNCD, or any combination thereof.

16. The method of claim 10, wherein at least one diamond layer is homoepitaxial.

17. A substantially all diamond transistor, comprising an electrically insulating substrate that includes $SiO_2$,
an electrically conductive diamond layer of nitrogen doped UNCD less than about 20 nm thick on said electrically insulating substrate,
a source contact and a drain contact on said electrically conductive diamond layer, a laterally self-aligned electrically insulating diamond layer of nanocrystalline with contacts of Ti or Mo or alloys thereof less than about 200 nm thick in contact with said electrically conductive diamond layer, and
a gate contact of Ti or Mo or alloys thereof or Au on said electrically insulating diamond layer.

18. A substantially all diamond transistor, comprising
an electrically insulating substrate of homoepitaxial diamond,
an electrically conductive boron doped homoepitaxial layer less than about 10 nm thick on the electrically insulating substrate of homoepitaxial diamond, a tungsten source contact and a tungsten drain contact on the electrically conductive boron doped homoepitaxial layer, a self-aligned intrinsic, insulating homoepitaxial diamond layer less than about 200 nm thick in contact with the electrically conductive boron doped homoepitaxial layer, and a tungsten gate contact on the self-aligned homoepitaxial diamond layer.

19. A substantially all diamond transistor comprising
an electrically insulating substrate,
an electrically conductive diamond layer on said electrically insulating substrate,
a source contact and a drain contact on said electrically conductive diamond layer, an electrically insulating diamond layer in contact with said electrically conductive diamond layer, and
a gate contact on said electrically insulating diamond layer; and wherein said insulating diamond layer is homoepitaxial.

20. A method of making a substantially all diamond self-aligned gate transistor, comprising
providing an electrically insulating substrate,
depositing an electrically conductive diamond layer on the electrically insulating substrate,
establishing a source contact and a drain contact on the electrically conductive diamond layer,
depositing an electrically insulating diamond layer in contact with the electrically conductive diamond layer, and
providing a gate contact on the electrically insulating diamond layer wherein the substrate includes a non-diamond material seeded with diamond powder and thereafter growing a diamond layer thereon.

21. A substantially all diamond transistor, comprising an electrically insulating substrate,
an electrically conductive diamond layer less than about 20 nm thick on said electrically insulating substrate,
a source contact and a drain contact on said electrically conductive diamond layer, a self-aligned electrically insulating diamond layer less than about 500 nm thick in contact with said electrically conductive diamond layer, and
a gate contact on said electrically insulating diamond layer;
said electrically insulating substrate includes $SiO_2$ and an electrically conducting diamond layer of nitrogen doped UNCD less than about 20 nm thick, said electrically insulating diamond layer being nanocrystalline diamond with contacts of Ti or Mo or alloys thereof and a gate of Ti or Mo or alloys thereof or Au.

22. A substantially all diamond transistor comprising,
an electrically insulating substrate,
an electrically conductive diamond layer on said electrically insulating substrate,
a source contact and a drain contact on said electrically conductive diamond layer,
an electrically insulating diamond layer in contact with said electrically conductive diamond layer, and
a gate contact on said electrically insulating diamond layer, wherein at least one diamond layer is ultrananocrystalline diamond (UNCD).

* * * * *